United States Patent
Yoshikawa et al.

(10) Patent No.: US 9,572,256 B2
(45) Date of Patent: Feb. 14, 2017

(54) PRINTED WIRING BOARD, METHOD FOR MANUFACTURING PRINTED WIRING BOARD, AND PACKAGE-ON-PACKAGE

(71) Applicant: IBIDEN CO., LTD., Ogaki-shi (JP)

(72) Inventors: Kazuhiro Yoshikawa, Ogaki (JP); Takashi Kariya, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 145 days.

(21) Appl. No.: 14/633,864

(22) Filed: Feb. 27, 2015

(65) Prior Publication Data

US 2015/0250054 A1 Sep. 3, 2015

(30) Foreign Application Priority Data

Feb. 28, 2014 (JP) ................ 2014-038891

(51) Int. Cl.
| | |
|---|---|
| H05K 7/10 | (2006.01) |
| H05K 7/12 | (2006.01) |
| H05K 1/11 | (2006.01) |
| H01L 23/00 | (2006.01) |
| H05K 3/28 | (2006.01) |
| H05K 3/40 | (2006.01) |
| H05K 1/14 | (2006.01) |
| H05K 3/46 | (2006.01) |
| H05K 3/34 | (2006.01) |

(52) U.S. Cl.
CPC .............. *H05K 1/111* (2013.01); *H01L 24/09* (2013.01); *H05K 3/28* (2013.01); *H05K 3/4007* (2013.01); *H01L 2224/16225* (2013.01); *H01L 2924/12042* (2013.01); *H01L 2924/15311* (2013.01); *H01L 2924/181* (2013.01); *H01L 2924/18161* (2013.01); *H05K 1/144* (2013.01); *H05K 3/3436* (2013.01); *H05K 3/3452* (2013.01); *H05K 3/3478* (2013.01); *H05K 3/4644* (2013.01); *H05K 2201/042* (2013.01); *H05K 2201/068* (2013.01); *H05K 2201/098* (2013.01); *H05K 2201/09745* (2013.01); *H05K 2201/10977* (2013.01);

(Continued)

(58) Field of Classification Search
CPC .............. H01L 25/0657; H01L 25/105; H01L 21/6835; H01L 24/97; H01L 21/56; H05K 3/06; H05K 1/144–1/148; H05K 3/0429
USPC ......... 361/770–795, 760–767; 174/259–264; 257/686–774
See application file for complete search history.

(56) References Cited

U.S. PATENT DOCUMENTS

| | | | | |
|---|---|---|---|---|
| 5,334,804 A | * | 8/1994 | Love | ...................... H01L 21/486 |
| | | | | 174/257 |
| 9,137,900 B2 | * | 9/2015 | Tanaka | ................ H01L 23/3121 |

(Continued)

FOREIGN PATENT DOCUMENTS

JP 2003-008228 1/2003

*Primary Examiner* — Tuan T Dinh
(74) *Attorney, Agent, or Firm* — Oblon, McClelland, Maier & Neustadt, L.L.P.

(57) ABSTRACT

A printed wiring board includes an uppermost insulating layer, first pads positioned to mount an IC chip on the insulating layer, second pads positioned to mount a second printed wiring board on the insulating layer, metal posts formed on the second pads, respectively, such that the metal posts mount the second board over the chip, and a solder resist layer formed on the uppermost insulating layer and having first and second openings such that the first openings exposes the first pads and that the second openings exposes the second pads, respectively. The metal posts are formed such that each of the metal posts has a diameter which is smaller than a diameter of each of the second opening portions, and the second opening portions are formed such that the diameter of each of the second opening portions is smaller than a diameter of each of the second pads.

16 Claims, 14 Drawing Sheets

(51) Int. Cl.
(52) U.S. Cl.
CPC ........ *H05K 2201/2072* (2013.01); *H05K 2203/0353* (2013.01); *H05K 2203/0361* (2013.01); *H05K 2203/0405* (2013.01); *H05K 2203/0594* (2013.01); *H05K 2203/0597* (2013.01); *H05K 2203/1184* (2013.01)

(56) References Cited

U.S. PATENT DOCUMENTS

| | | | |
|---|---|---|---|
| 2003/0019568 A1* | 1/2003 | Liu | B32B 7/12 156/245 |
| 2008/0142944 A1* | 6/2008 | Oi | H01L 25/105 257/686 |
| 2009/0127688 A1* | 5/2009 | Lee | H01L 24/97 257/686 |
| 2010/0219522 A1* | 9/2010 | Kunimoto | H01L 21/6835 257/686 |
| 2010/0244242 A1* | 9/2010 | Komatsu | H01L 21/486 257/737 |
| 2011/0175235 A1* | 7/2011 | Horiuchi | H01L 23/49811 257/774 |
| 2012/0193789 A1* | 8/2012 | Hu | H01L 21/56 257/738 |
| 2013/0157418 A1* | 6/2013 | Choi | H01L 23/49811 438/127 |
| 2013/0249083 A1* | 9/2013 | Hu | H01L 23/49811 257/737 |

\* cited by examiner

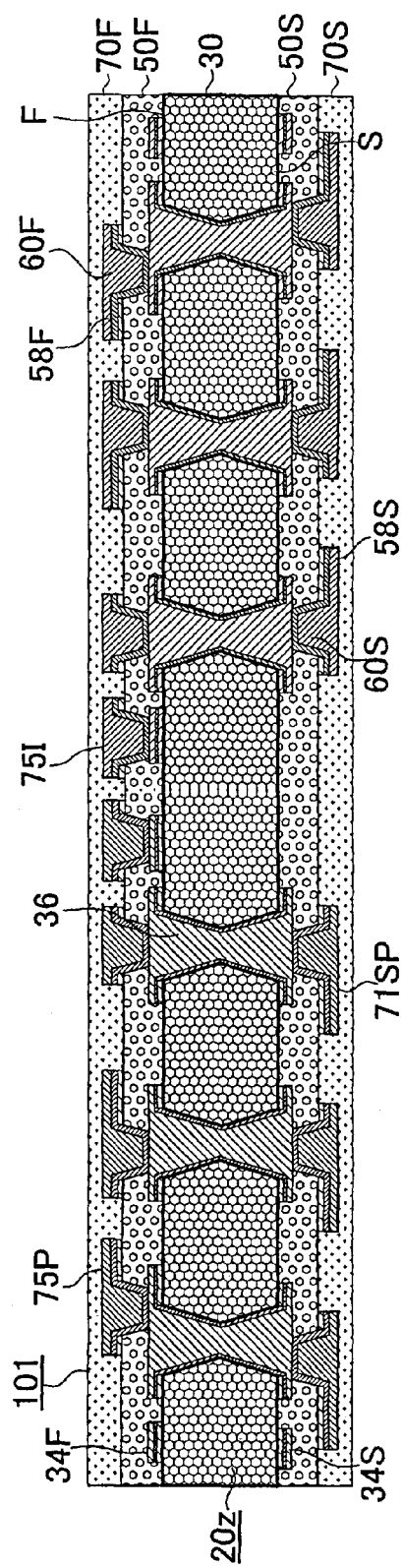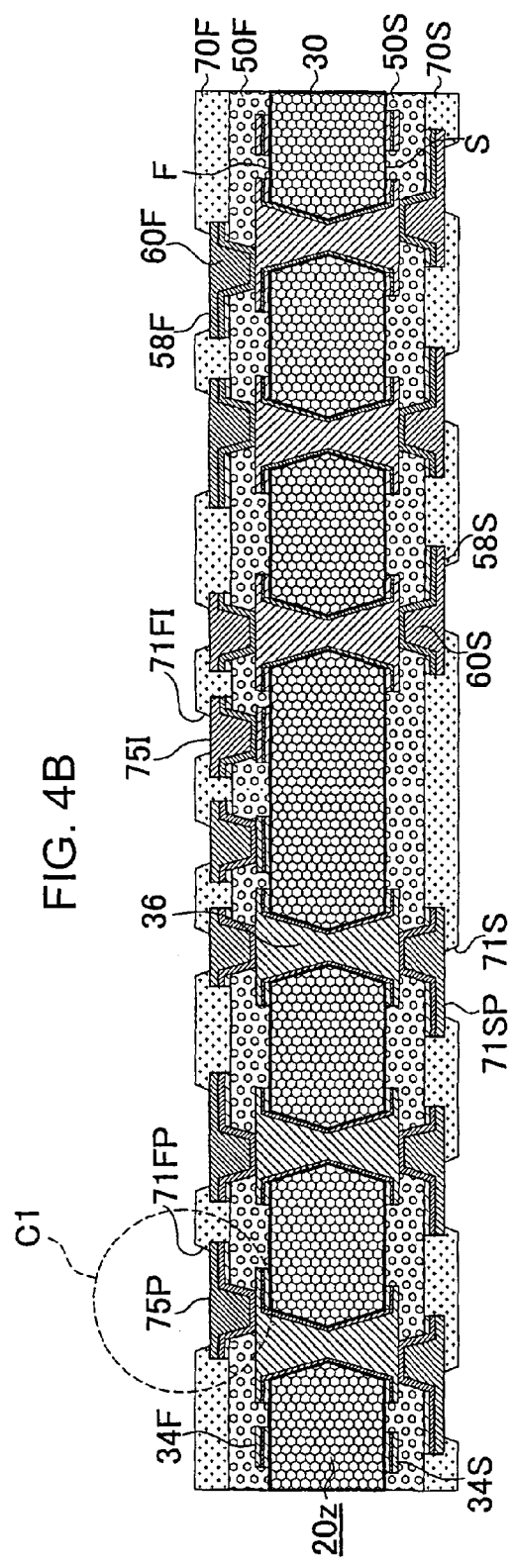

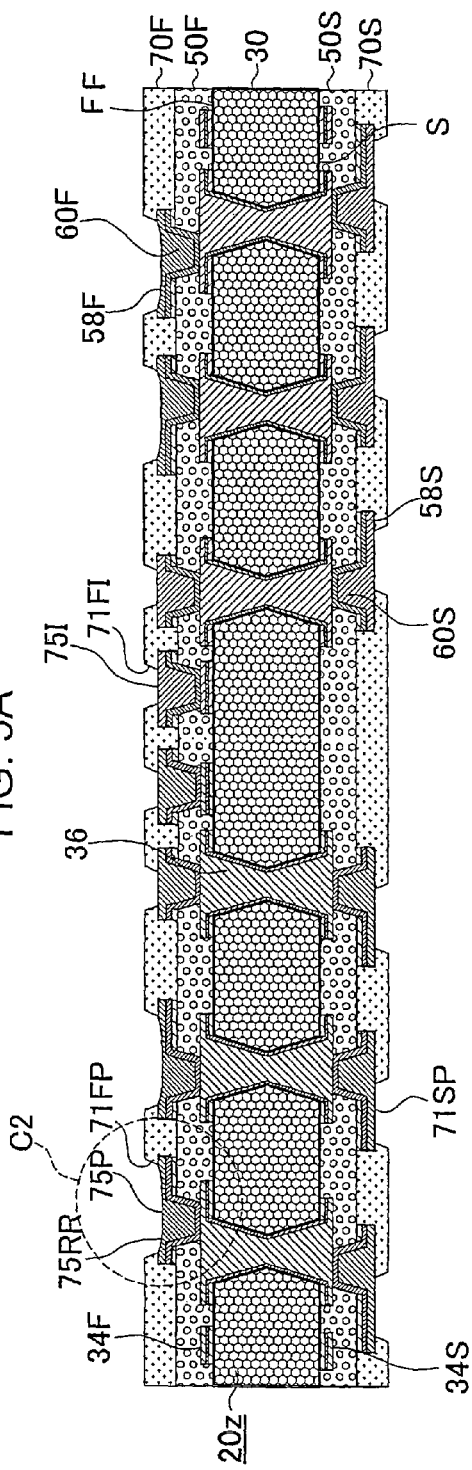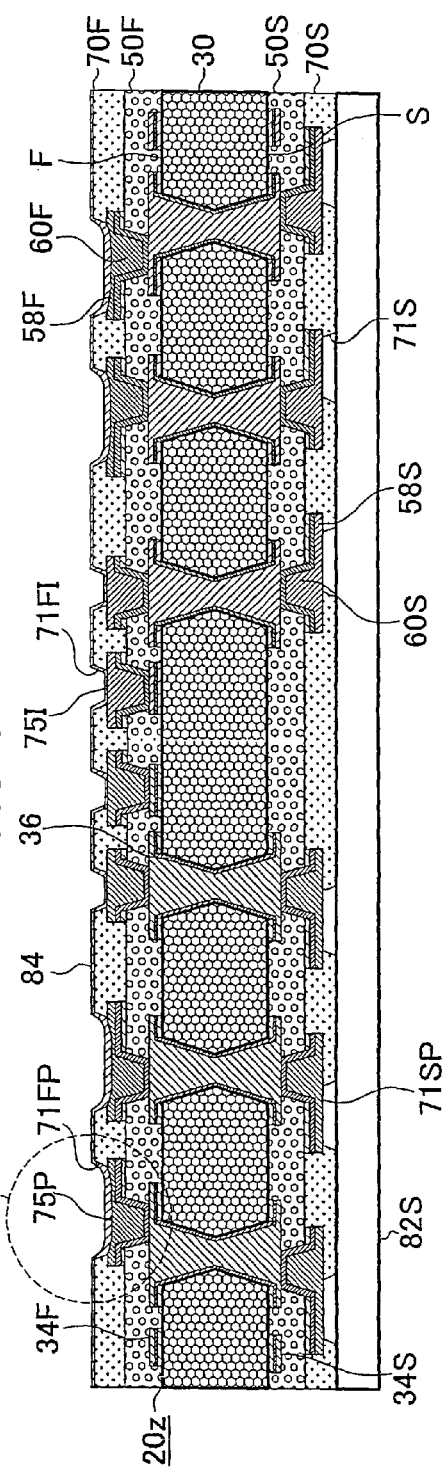

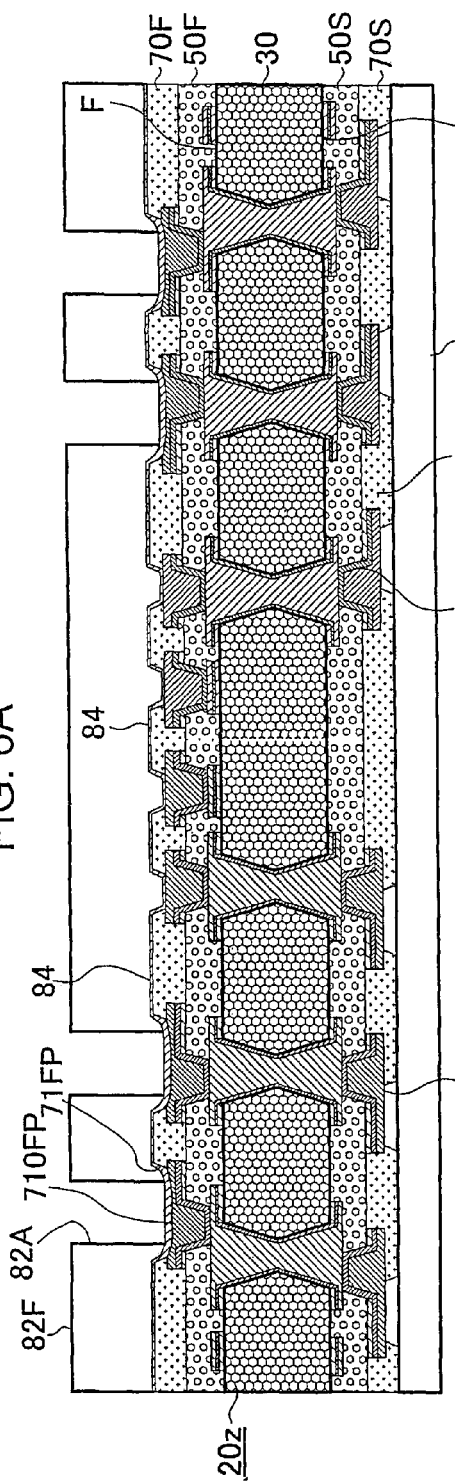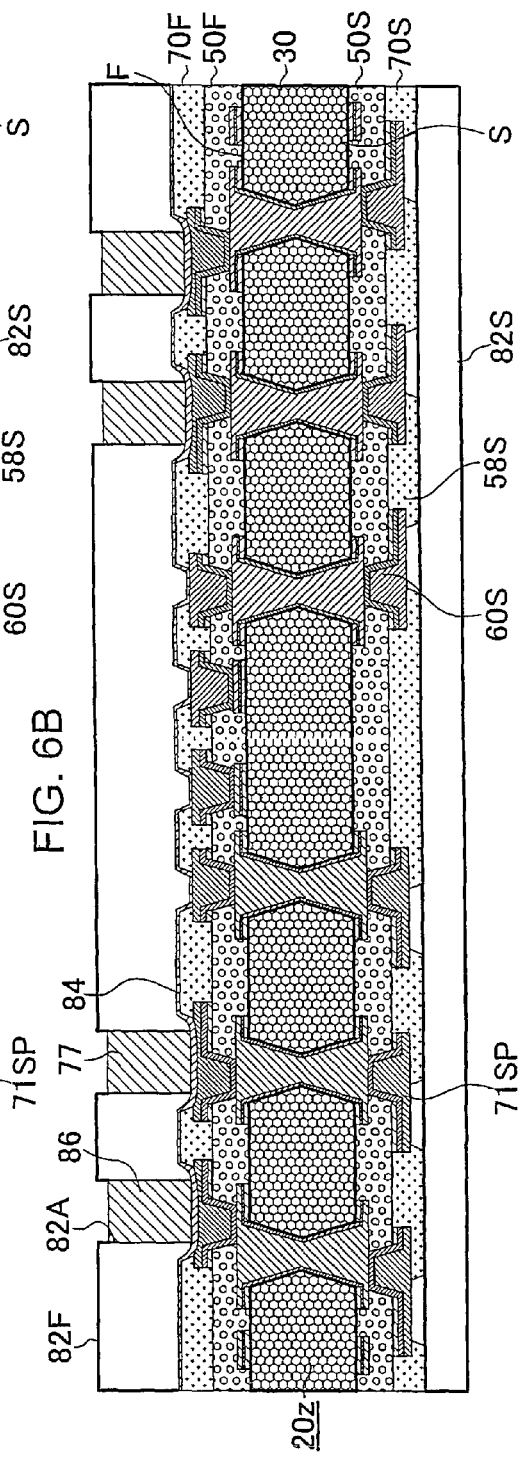

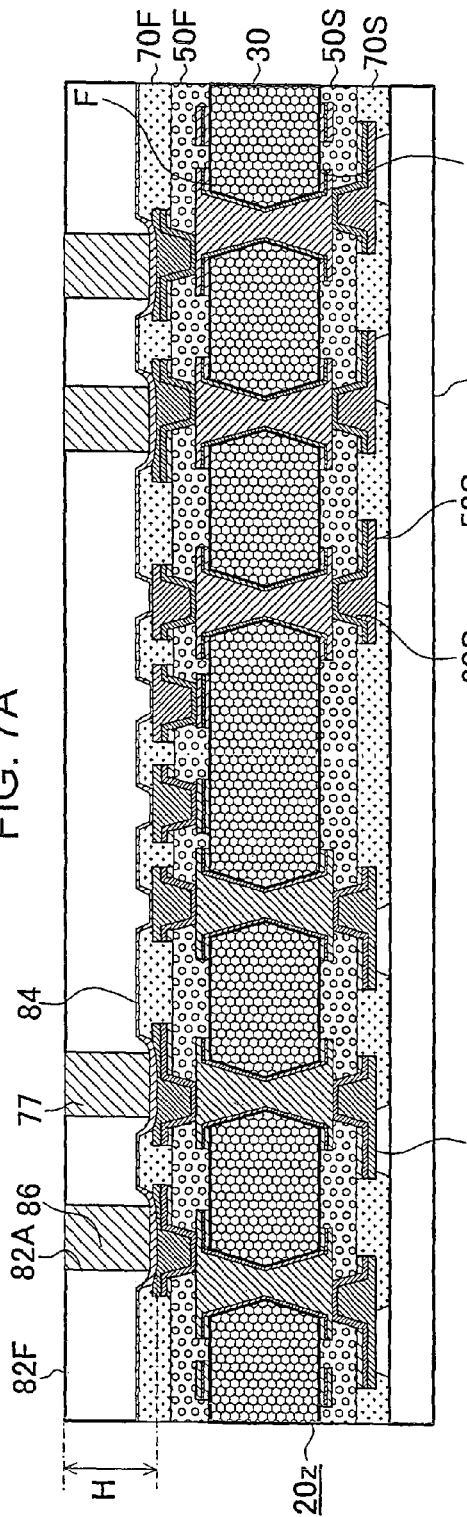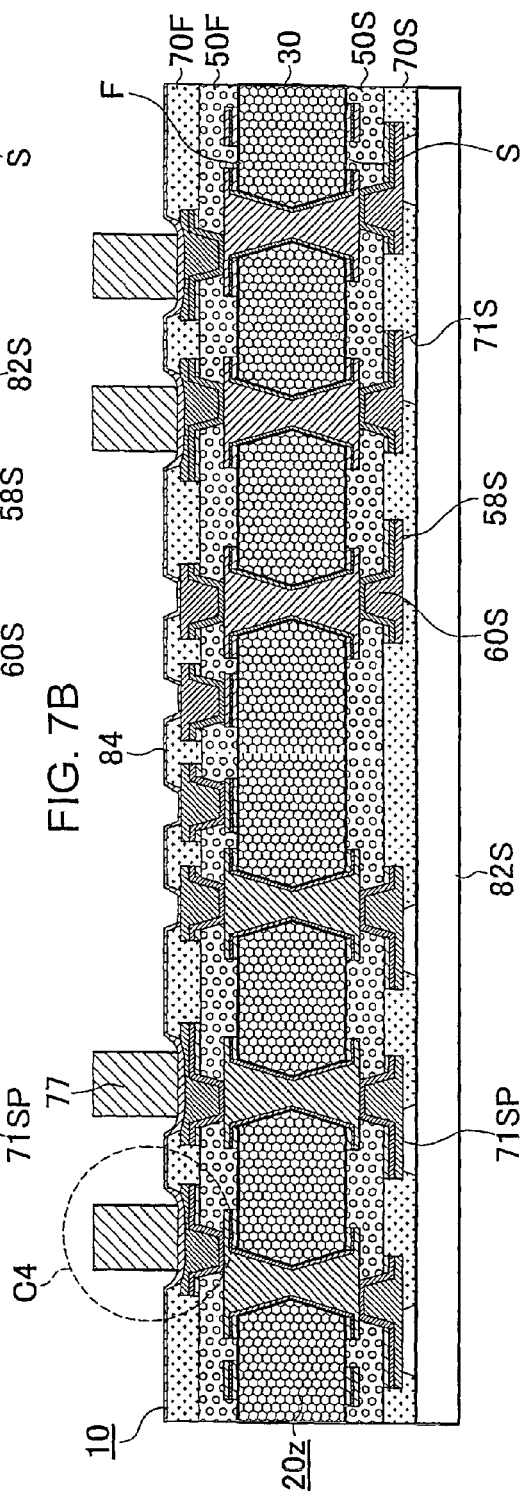
FIG. 7A
FIG. 7B

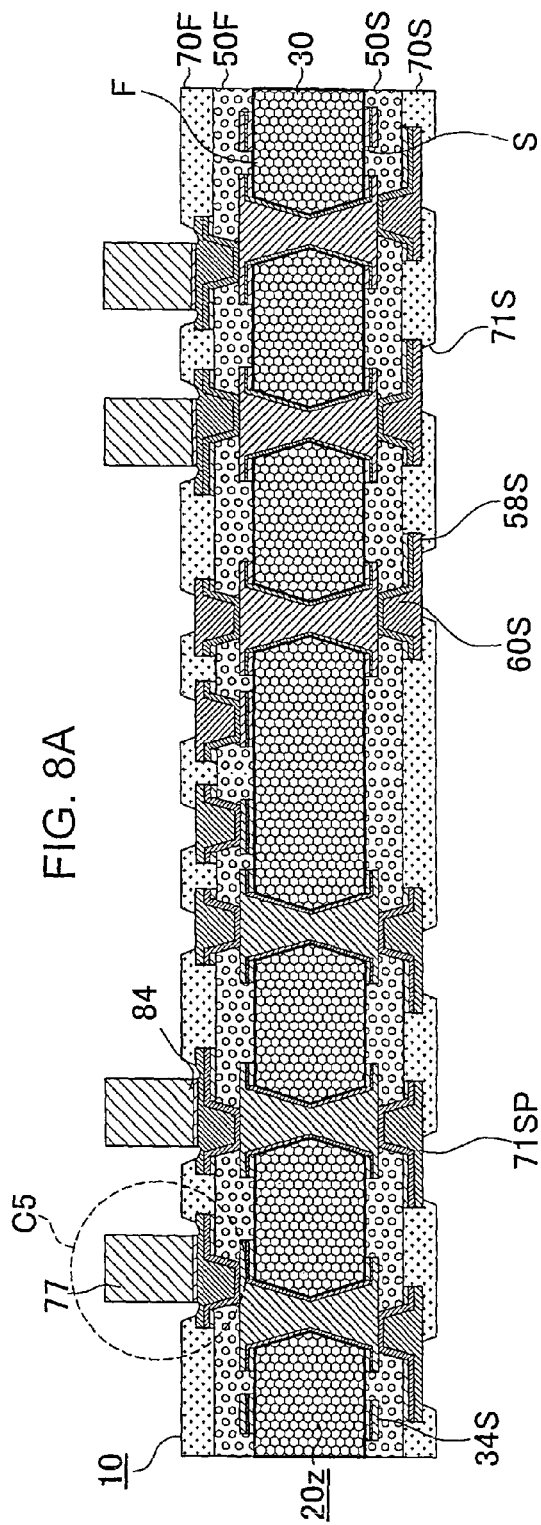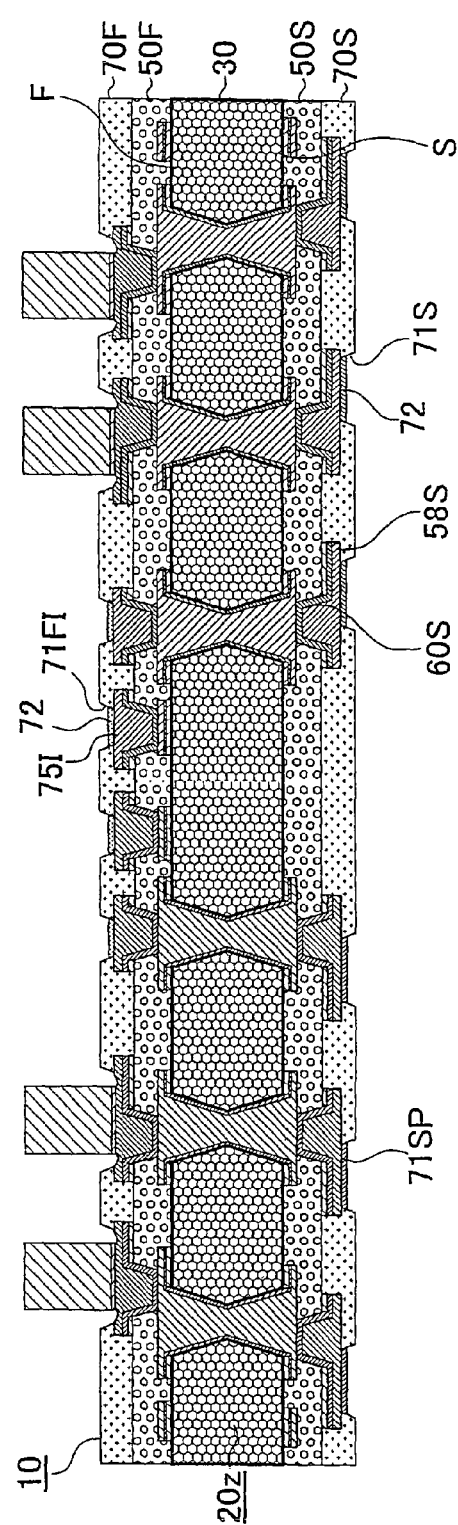

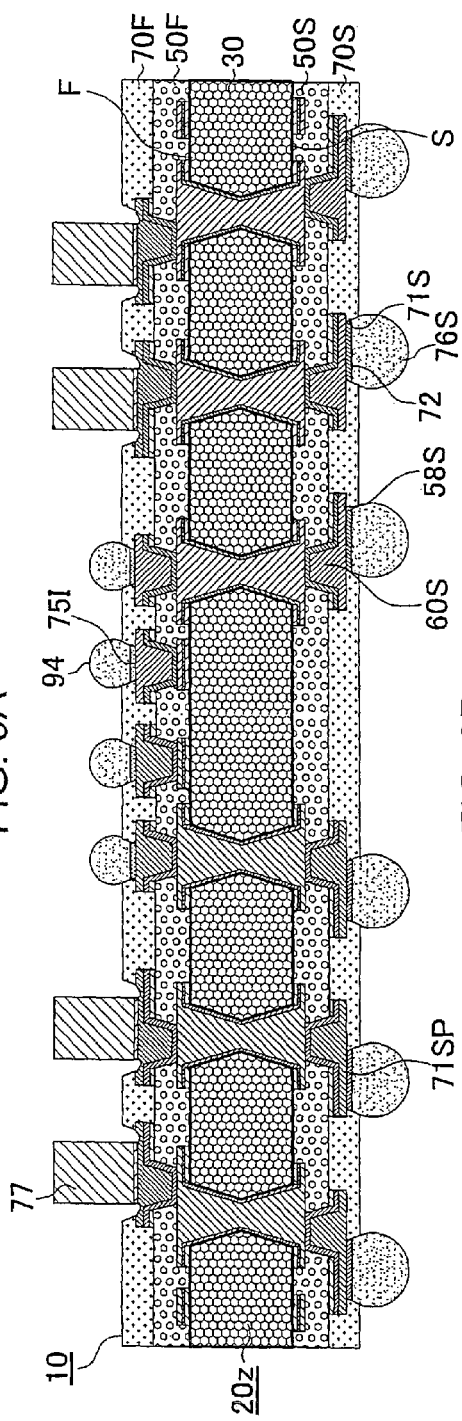
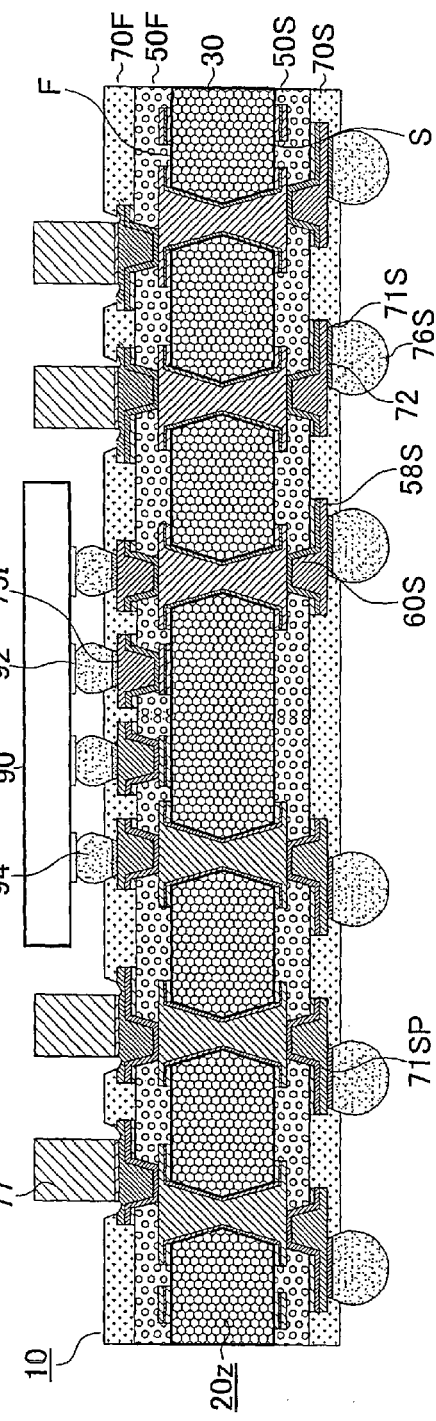

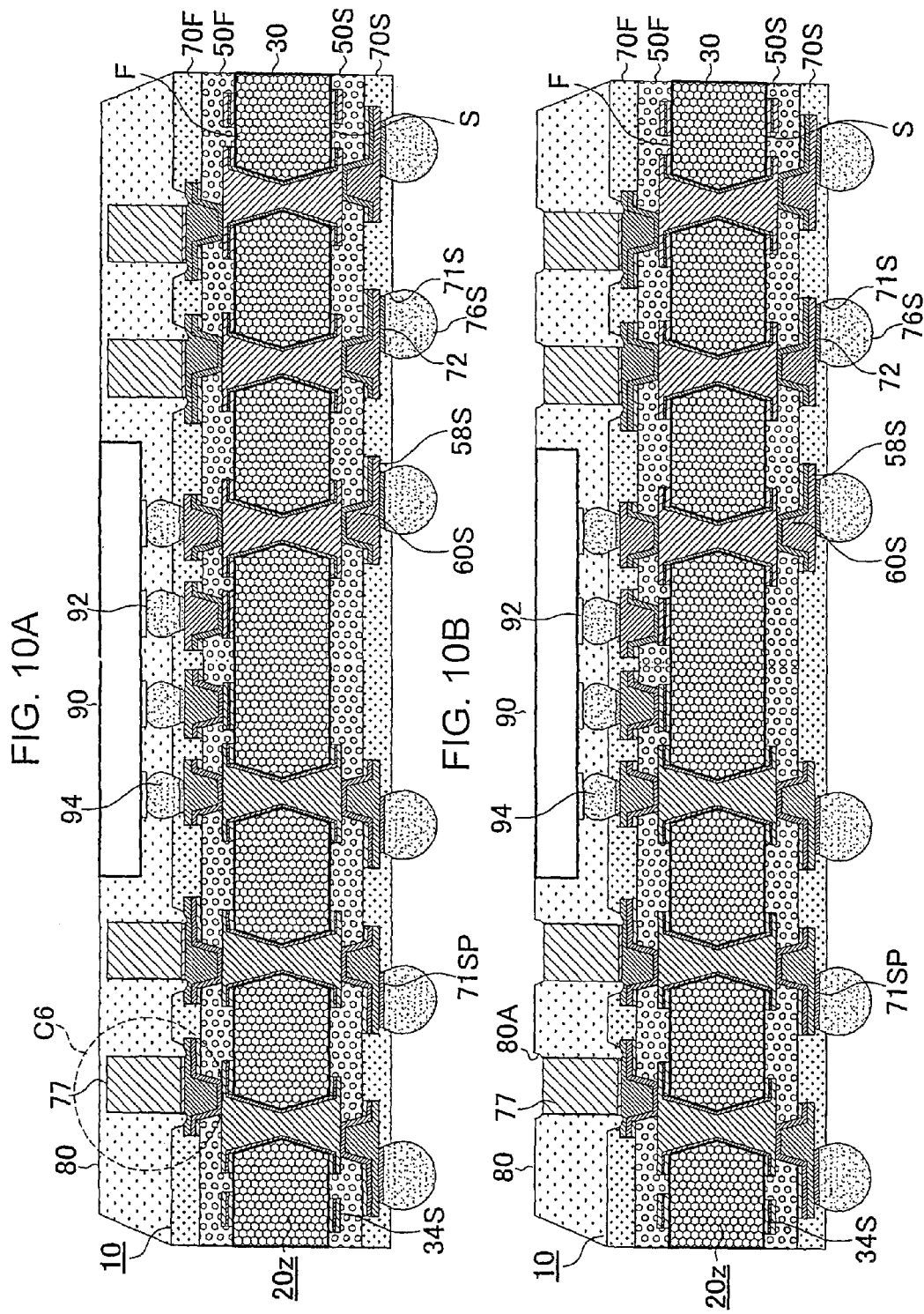

PRINTED WIRING BOARD, METHOD FOR MANUFACTURING PRINTED WIRING BOARD, AND PACKAGE-ON-PACKAGE

CROSS-REFERENCE TO RELATED APPLICATIONS

The present application is based upon and claims the benefit of priority to Japanese Patent Application No. 2014-038891, filed Feb. 28, 2014, the entire contents of which are incorporated herein by reference.

BACKGROUND OF THE INVENTION

Field of the Invention

The present invention relates to a printed wiring board having a metal post for mounting another printed wiring board (upper substrate), and a method for manufacturing the printed wiring board.

Description of Background Art

Japanese Patent Laid-Open Publication No. 2003-8228 describes a method for forming a metal post on a pad of a printed wiring board. The entire contents of this publication are incorporated herein by reference.

SUMMARY OF THE INVENTION

According to one aspect of the present invention, a printed wiring board includes an uppermost interlayer resin insulating layer, first pads formed in a center portion of a surface of the uppermost interlayer resin insulating layer such that the first pads are positioned to mount an IC chip on the uppermost interlayer resin insulating layer, second pads formed in a peripheral portion of the surface of the uppermost interlayer resin insulating layer such that the second pads are positioned to mount a second printed wiring board on the uppermost interlayer resin insulating layer, metal posts formed on the second pads, respectively, such that the metal posts mount the second printed wiring board over the IC chip, and a solder resist layer formed on the uppermost interlayer resin insulating layer and having first opening portions and second opening portions such that the first opening portions are exposing the first pads, respectively, and that the second opening portions are exposing the second pads, respectively. The metal posts are formed such that each of the metal posts has a diameter which is smaller than a diameter of each of the second opening portions, and the second opening portions are formed such that the diameter of each of the second opening portions is smaller than a diameter of each of the second pads.

According to another aspect of the present invention, a method for manufacturing a printed wiring board includes forming a solder resist layer on an outermost interlayer resin insulating layer such that the solder resist layer has first opening portions exposing first pads, respectively, and second opening portions exposing second pads, respectively, applying a roughening treatment to a surface of the solder resist layer such that a recess portion is formed on a surface of a respective one of the second pads, forming a seed layer on the solder resist layer such that the seed layer is formed on the first pads in the first opening portions and the second pads in the second opening portions, forming a plating resist layer on the seed layer such that the plating resist layer has resist openings formed on the second pads, respectively, and each having a diameter which is smaller than a diameter of each of the second opening portions, applying electrolytic plating on the seed layer in the resist openings such that metal posts are formed in the resist openings, respectively, removing the plating resist layer from the seed layer, and removing a portion of the seed layer exposed on the solder resist layer. The first pads are formed in a center portion of a surface of the uppermost interlayer resin insulating layer such that the first pads are positioned to mount an IC chip on the uppermost interlayer resin insulating layer, the second pads are formed in a peripheral portion of the surface of the uppermost interlayer resin insulating layer such that the second pads are positioned to mount a second printed wiring board on the uppermost interlayer resin insulating layer, and the metal posts are formed on the second pads, respectively, such that the metal posts mount the second printed wiring board over the IC chip.

According to yet another aspect of the present invention, a package-on-package device includes a first printed wiring board, an IC chip mounted on the first printed wiring board, and a second printed wiring board mounted on the first printed wiring board such that the IC chip is positioned in a space formed between the first printed wiring board and the second printed wiring board. The first printed wiring board includes an uppermost interlayer resin insulating layer, first pads formed in a center portion of a surface of the uppermost interlayer resin insulating layer such that the first pads are positioned to mount the IC chip on the uppermost interlayer resin insulating layer, second pads formed in a peripheral portion of the surface of the uppermost interlayer resin insulating layer such that the second pads are positioned to mount the second printed wiring board on the uppermost interlayer resin insulating layer, metal posts formed on the second pads, respectively, such that the metal posts mount the second printed wiring board over the IC chip, and a solder resist layer formed on the uppermost interlayer resin insulating layer and having first opening portions and second opening portions such that the first opening portions are exposing the first pads, respectively, and that the second opening portions are exposing the second pads, respectively, the metal posts are formed such that each of the metal posts has a diameter which is smaller than a diameter of each of the second opening portions, and the second opening portions are formed such that the diameter of each of the second opening portions is smaller than a diameter of each of the second pads.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 4A and 4B illustrate manufacturing process diagrams of the printed wiring board according to the first embodiment;

FIGS. 5A and 5B illustrate manufacturing process diagrams of the printed wiring board according to the first embodiment;

FIGS. 6A and 6B illustrate manufacturing process diagrams of the printed wiring board according to the first embodiment;

FIGS. 7A and 7B illustrate manufacturing process diagrams of the printed wiring board according to the first embodiment;

FIGS. 8A and 8B illustrate manufacturing process diagrams of the printed wiring board according to the first embodiment;

FIGS. 9A and 9B illustrate manufacturing process diagrams of the printed wiring board according to the first embodiment;

FIGS. 10A and 10B illustrate manufacturing process diagrams of the printed wiring board according to the first embodiment;

DETAILED DESCRIPTION OF THE EMBODIMENTS

Figure 1:
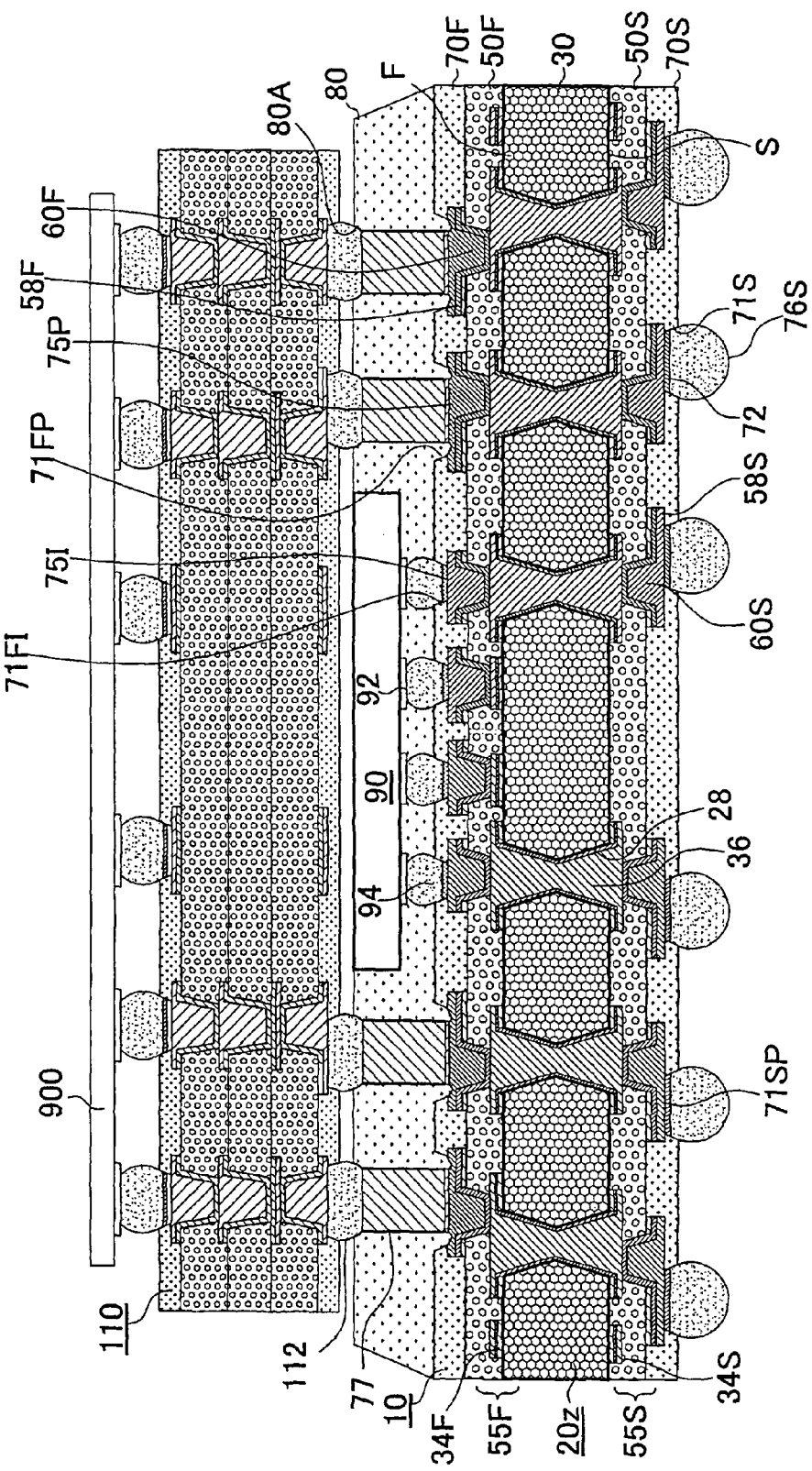
FIG. 1 illustrates a cross-sectional view of an applied example of a printed wiring board according to a first embodiment of the present invention.

The embodiments will now be described with reference to the accompanying drawings, wherein like reference numerals designate corresponding or identical elements throughout the various drawings.

First Embodiment

An applied example of a printed wiring board 10 according to a first embodiment of the present invention is illustrated in FIG. 1.

The printed wiring board 10 has a pad (first pad) (75I) for mounting an electronic part 90 such as an IC chip and a pad (second pad) (75P) for mounting another printed wiring board (upper substrate) 110. An electronic component 900 such as a memory is mounted on the other printed wiring board. Multiple pads (75I) form a pad group (C4) (see FIG. 3A). The pad group (C4) is formed substantially at a center of the printed wiring board 10. The pad (75P) is formed in an outer periphery region (P4) (see FIG. 3A) around the pad group (C4). A joining post (metal post) 77 for mounting the upper substrate is formed on the pad (75P). The metal post has a shape of, for example, a circular cylinder. The metal post 77 has a function of electrically connecting the printed wiring board 10 and the printed wiring board 110. Further, even when a pitch (p1) between the pads (75P) is 0.3 mm or less, a distance between the printed wiring board 10 of the embodiment and the printed wiring board (upper substrate) 110 is ensured by the metal post 77. Even when the pitch (p1) between the pads (75P) is 0.25 mm or less, the distance between the printed wiring board 10 of the embodiment and the printed wiring board (upper substrate) 110 is kept constant by the metal post 77. Insulation between adjacent pads is ensured. The pitch (p1) is a distance between centers of adjacent pads (75P).

The printed wiring board of the embodiment may be a printed wiring board having a core substrate, or may be a coreless substrate. A printed wiring board having a core substrate and a manufacturing method thereof are described, for example, in JP2007227512A. The entire contents of this publication are incorporated herein by reference. A coreless substrate and a manufacturing method thereof are described, for example, in JP2005236244A. The coreless substrate has interlayer resin insulating layers and conductor layers that are alternately laminated. All of the interlayer resin insulating layers have a thickness of, for example, 60 µm or less.

The printed wiring board 10 of the first embodiment has a core substrate 30. The core substrate has an insulating substrate (20z) that has a first surface (F) and a second surface (S) that is on an opposite side of the first surface; a first conductor layer (34F) that is formed on the first surface (F) of the insulating substrate; and a second conductor layer (34S) that is formed on the second surface of the insulating substrate. The core substrate further has a through-hole conductor 36 that fills a through hole 28 for the through-hole conductor with a plating film, the through hole 28 being formed in the insulating substrate (20z). The through-hole conductor 36 connects the first conductor layer (34F) and the second conductor layer (34S). A first surface of the core substrate and the first surface of the insulating substrate are the same surface; and a second surface of the core substrate and the second surface of the insulating substrate are the same surface.

On the first surface (F) of the core substrate 30, an interlayer resin insulating layer (uppermost interlayer resin insulating layer) (50F) is formed. On the interlayer resin insulating layer (50F), a conductor layer (uppermost conductor layer) (58F) is formed. The conductor layer (58F), the first conductor layer (34F) and the through-hole conductor are connected by a via conductor (uppermost via conductor) (60F) that penetrates through the interlayer resin insulating layer (50F). An upper side build-up layer (55F) is formed by the interlayer resin insulating layer (50F), the conductor layer (58F) and the via conductor (60F). In the first embodiment, the upper side build-up layer is a single layer. The uppermost conductor layer has the pads (75I, 75P). The pads (75I, 75P) are an upper surface of a conductor circuit contained in the uppermost conductor layer and an upper surface of the uppermost via conductor.

On the second surface (S) of the core substrate 30, an interlayer resin insulating layer (lowermost interlayer resin insulating layer) (50S) is formed. On the interlayer resin insulating layer (50S), a conductor layer (lowermost conductor layer) (58S) is formed. The conductor layer (58S), the second conductor layer (34S) and the through-hole conductor are connected by a via conductor (lowermost via conductor) (60S) that penetrates the interlayer resin insulating layer (50S). A lower side build-up layer (55S) is formed by the interlayer resin insulating layer (50S), the conductor layer (58S) and the via conductor (60S). In the first embodiment, the lower side build-up layer is a single layer. The lowermost conductor layer has a BGA pad (71 SP) for connecting to a motherboard. The pad (71 SP) is an upper surface of a conductor circuit contained in the lowermost conductor layer and an upper surface of the lowermost via conductor.

An upper side solder resist layer (70F) is formed on the upper side build-up layer, and a lower side solder resist layer (70S) is formed on the lower side build-up layer. The solder resist layer (70F) has an opening (first opening) (71FI) for exposing the pad (75I) and an opening (second opening) (71FP) for exposing the pad (75P). The solder resist layer (70S) has an opening (71S) for exposing the BGA pad (71SP). A solder bump (76S) for connecting to a motherboard is formed on the BGA pad (71SP). It is also possible that a solder bump is not provided, and a connection member such as a Sn film is provided instead of the solder bump. A pad of an IC chip 90 is connected to the pad (75I) via a solder bump 94.

Figure 2:
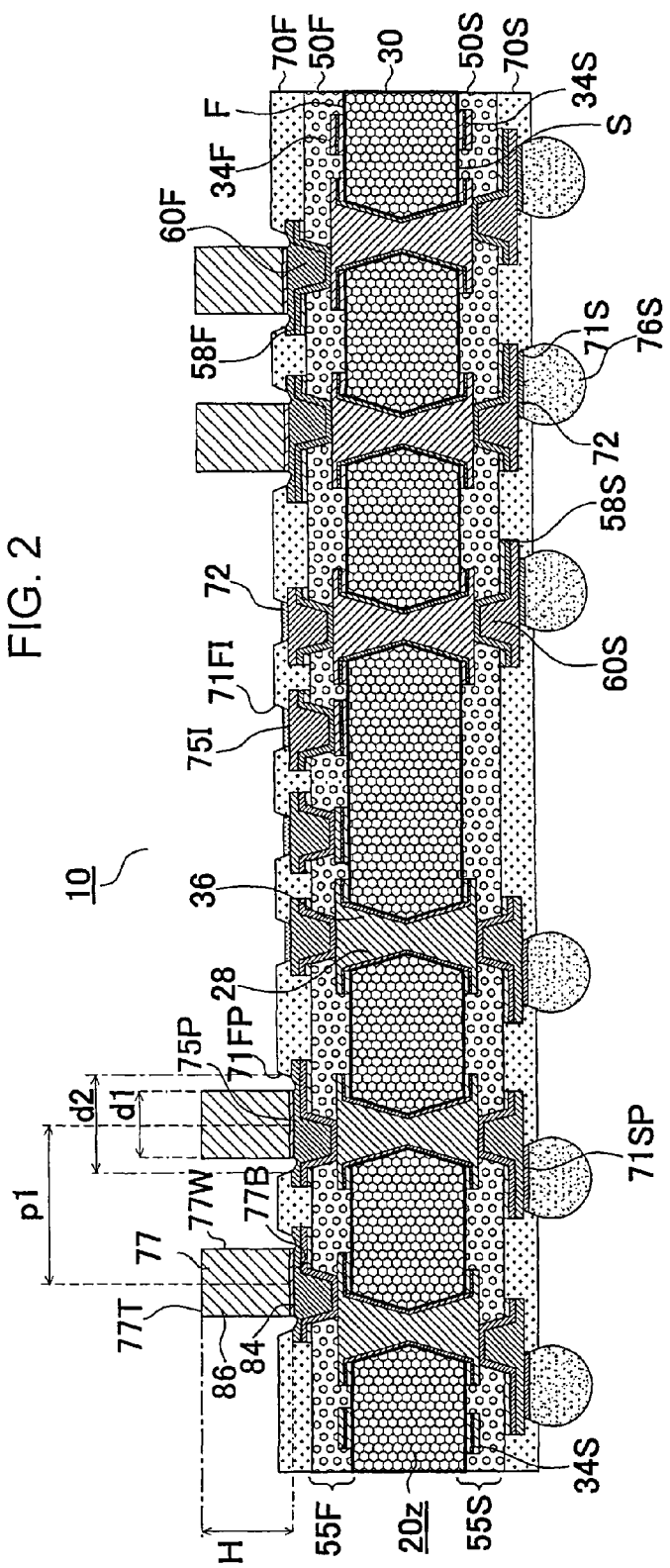
FIG. 2 illustrates a cross-sectional view of the printed wiring board of the first embodiment.

FIG. 2 illustrates a cross-sectional view of the printed wiring board 10 of the embodiment that has the solder bump (76S). A mounting surface has the upper side solder resist layer (70F) and the pads (75I, 75P). The metal post 77 is formed on the pad (75P).

Figure 12A:
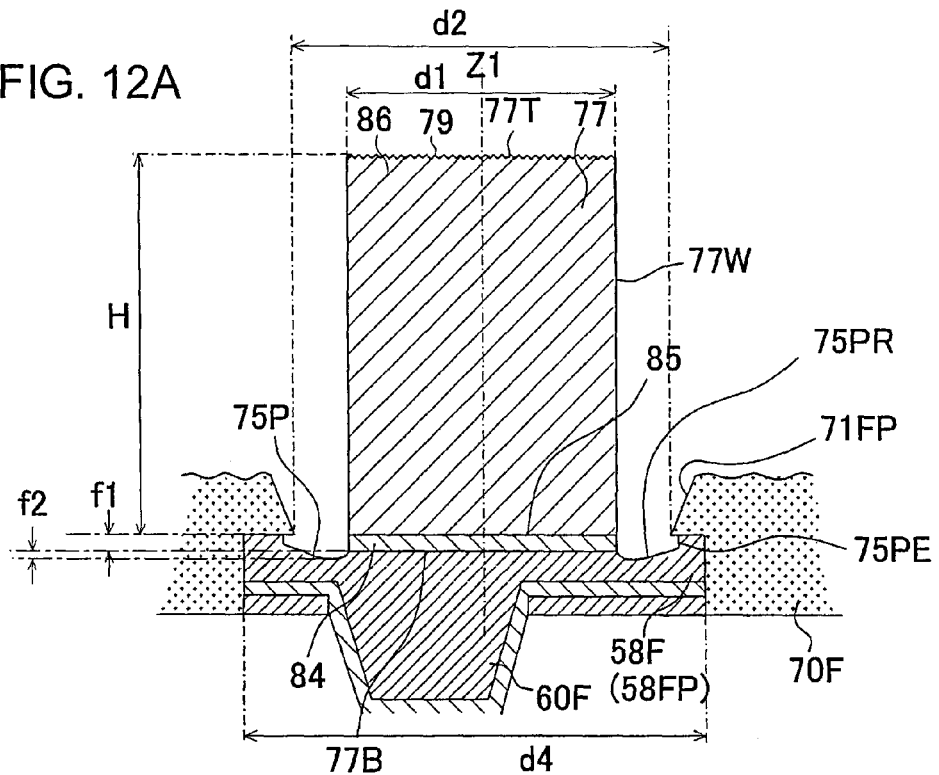
FIGS. 12A and 12B illustrate enlarged cross-sectional views of a metal post of the printed wiring board according to the first embodiment.

FIG. 12A illustrates an enlarged view of the metal post. The metal post has a shape of a circular cylinder. The metal post 77 has a top part (77T) and a bottom part (77B) that is on an opposite side of the top part. The metal post 77 has a side wall (77W) between the top part and the bottom part. The metal post 77 is formed from a seed layer 84 that is formed on a surface of the bottom part (77B) and an electrolytic plating film 86 that is formed on the seed layer. A roughened layer 79 is formed in a surface of the top part (77T). It is preferable that the roughened layer have an average roughness (Ra) of 0.03-0.26.

Figure 3A:
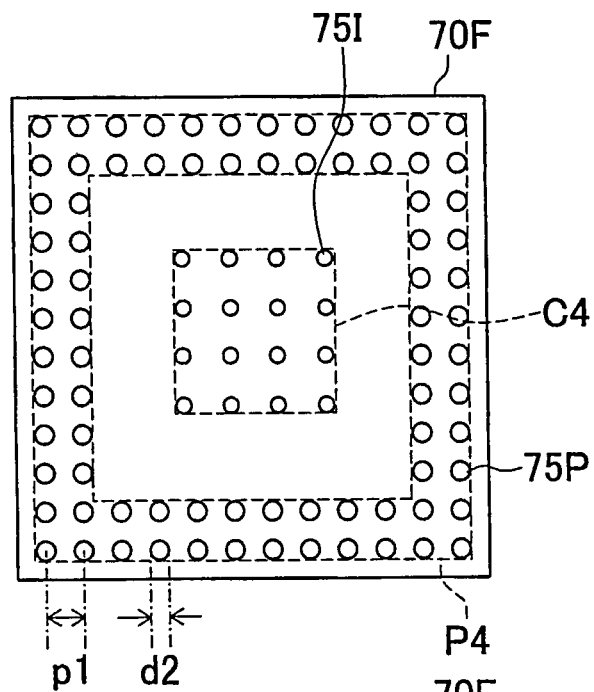
FIG. 3A illustrates a plan view of a mounting surface.
Figure 3B:
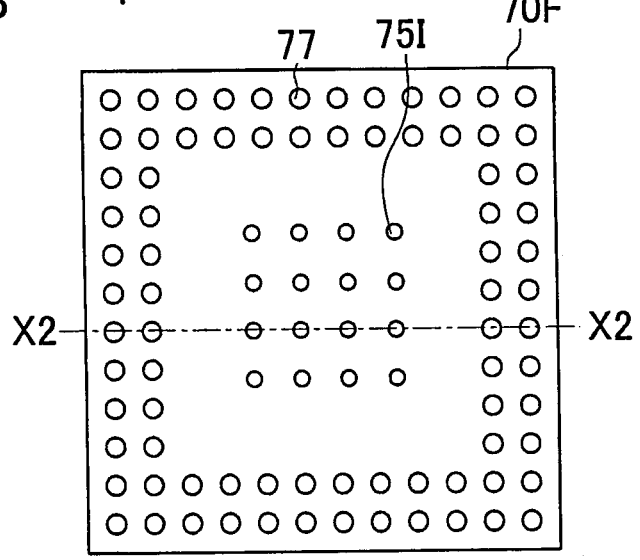
FIG. 3B illustrates a plan view illustrating a mounting surface that has a metal post.

The metal post has a diameter (d1) of 50-150 µm. The second opening (71FP) of the solder resist has a diameter (minimum diameter) (d2) of 70-200 µm. The diameter of the second opening is larger than the diameter of the metal post. It is preferable that a ratio (d1/d2) between the diameter (d1) of the metal post and the diameter (d2) of the second opening 71FP be in a range from 0.5 to 0.9. The pitch between the pads can be reduced. Even when the pitch (p1) illustrated in FIGS. 2 and 3A is 0.3 mm or less, connection reliability between the printed wiring board 10 and the upper substrate is high. Further, insulation reliability between the metal posts is high.

The second pad (75P) has a recess (75PR) around the metal post 77, the recess (75PR) being concentric with an axis (Z1) of the metal post. An interface (77B) between a bottom surface (77B) of the metal post and the second pad (75P) (the bottom part of the metal post) is at a position that is higher than a lowest part of the recess by f2: 1-10 µm and is lower than a highest part of the pad by f1: 1-10 µm.

In the printed wiring board according to the first embodiment, the diameter (d1) of the metal post 77 is smaller than the diameter (d2) of the second opening (71FP) of the solder resist layer (70F). Therefore, the metal post 77 is not in contact with the solder resist layer (70F) and does not received a thermal stress from the solder resist layer. Therefore, connection reliability between the metal posts is high.

Figure 12B:
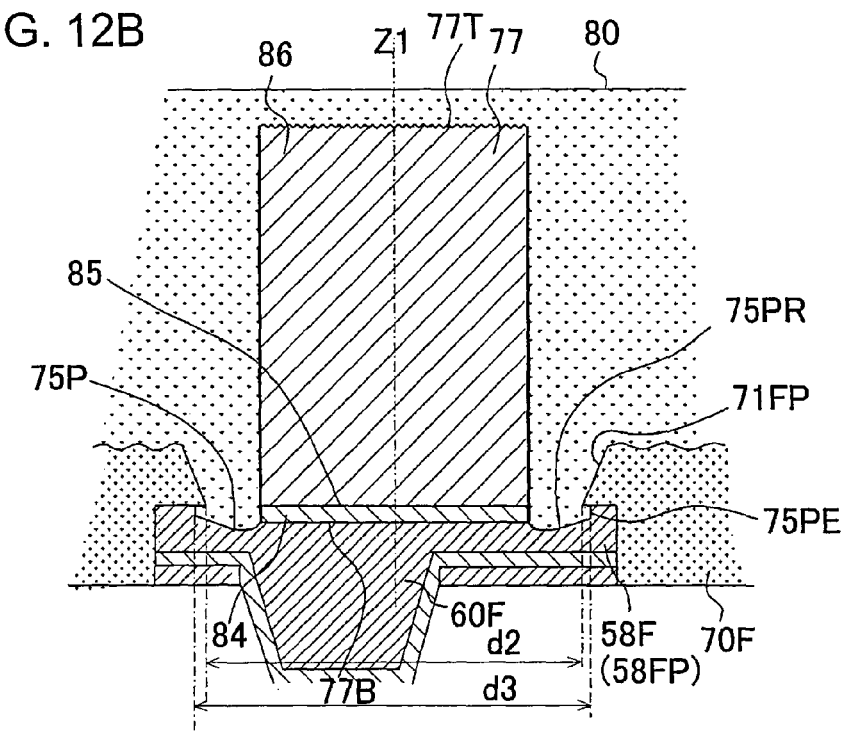

FIG. 12B illustrates a state in which a mold resin 80 is filled on the printed wiring board. The second pad (75P) has the recess (75PR) around the metal post, the recess (75PR) being concentric with the axis (Z1) of the metal post. Therefore, a position of an interface 85 between the seed layer 84 of the metal post 77 and the electrolytic copper plating layer 86, the position of the interface (77B) (the bottom part of the metal post) between the seed layer 84 and the second pad, and a position of an interface between the pad (75P) and the mold resin 80 that connects to the pad are displaced from each other. Further, a portion of the second pad that is in contact with the mold resin is in a concave shape. Therefore, as compared to a flat plate-like shape, a stress from the mold resin is dispersed in lateral directions. Therefore, a thermal stress that the metal post receives from the mold resin 80 is reduced so that the connection reliability of the metal post is enhanced.

In the first embodiment, a diameter (d3) of the second pad (75P) (diameter of an exposed part of the pad) is larger than the diameter (d2) of the second opening (71FP). The diameter of the second pad (75P) is a diameter of a portion of a conductor (a conductor circuit or a via conductor) that is exposed from the solder resist layer (70F). An outer edge (75PE) of the second pad (75P) extends to a back surface of the solder resist layer (70F). Therefore, the mold resin 80 wraps around the back surface of the solder resist layer so that adhesion between the solder resist layer and the mold resin is high. The second pad (75P) is formed on a mounting pad (58FP) of a circular shape concentric with the second opening (71FP). The mounting pad (58FP) is included in the uppermost conductor layer (58F). A diameter (d4) of the mounting pad (58FP) is larger than the diameter (d3) of the second pad (75P).

The distance (pitch) (p1) (see FIG. 2) between adjacent pads (75P) is 100 µm-300 µm. When the pitch (p1) is less than 100 µm, the insulation reliability between the metal posts is likely to decrease. Further, since the metal post becomes thin, the connection reliability between the upper substrate and the printed wiring board 10 is decreased. When the pitch (p1) exceeds 300 µm, a size of the printed wiring board 10 is increased. Therefore, the stress acting on the metal post is increased and thus the connection reliability between the upper substrate and the printed wiring board 10 is decreased.

When the pitch (p1) is 0.3 mm or less, a height (H) of the metal post 77 (distance from the top part to a front end of the bottom part) is 75 µm-200 µm, and the diameter (d1) of the metal post is 125 µm-330 µm. The connection reliability between the printed wiring board of the embodiment and the upper substrate and the insulation reliability between the metal posts are improved.

It is preferable that an aspect ratio (height (H)/diameter (d1)) of the metal post be greater than 0.6. A stress between the upper substrate and the printed wiring board of the embodiment is relaxed by the metal post. The connection reliability is increased. It is preferable that the aspect ratio be 0.6-1.5. The stress between the upper substrate and the printed wiring board 10 is relaxed. Further, the metal post does not deteriorate due to fatigue. The connection reliability between the upper substrate and the printed wiring board 10 is increased.

In the first embodiment, the pitch (p1) can be reduced. Since a spacing distance between adjacent metal posts is large, even when the pitch (p1) is 0.3 mm or less, the insulation reliability between the metal posts is high. When the pitch (p1) is 0.25 mm or less, the metal post becomes thin. In order to increase the connection reliability, it is preferable that the aspect ratio (H/d1) of the metal post is 0.6 or more. When the number of the pads (75P) increases, a size of the printed wiring board is increased. However, when the aspect ratio (H/d1) of the metal post is 1 or more, a stress caused by a difference between a physical property of the upper substrate and a physical property of the printed wiring board is relaxed by the metal post. When the aspect ratio (H/d1) exceeds 1.5, the metal post deteriorates in a heat cycle. Examples of the physical property include a thermal expansion coefficient and a Young's modulus.

As illustrated in FIG. 1, the printed wiring board 10 and the upper substrate 110 are connected by the metal post 77 that has high rigidity. A thermal stress between the upper substrate and the printed wiring board is relaxed by the metal post 77. Strength of an electronic device that has the upper substrate and the printed wiring board is maintained by the metal post. Warpage of the electronic device due to a difference in a physical property of the upper substrate and a physical property of the printed wiring board is reduced.

FIG. 4A-9B illustrate a method for manufacturing the metal post.

A printed wiring board 101 illustrated in FIG. 4A, as described above, is manufactured using a method, for example, described in JP2007227512A. The printed wiring board 101 has, under the upper side solder resist layer (70F), the pad (first pad) (75I) for mounting the electronic part 90 such as an IC chip and the pad (second pad) (75P) for mounting the other printed wiring board (upper substrate) 110. Further, the printed wiring board 101 has, under the lower side solder resist layer (70S), the pad (71SP) for mounting printed wiring board 101 on a motherboard.

Using laser, on the upper side solder resist layer (70F), the first opening (71FI) is formed to expose the first pad (75I) and the second opening (71FP) is formed to expose the second pad (75P). Similarly, on the lower side solder resist layer (70S), the opening (71S) is formed to expose the pad (71SP) (FIG. 4B).

Figure 11A:
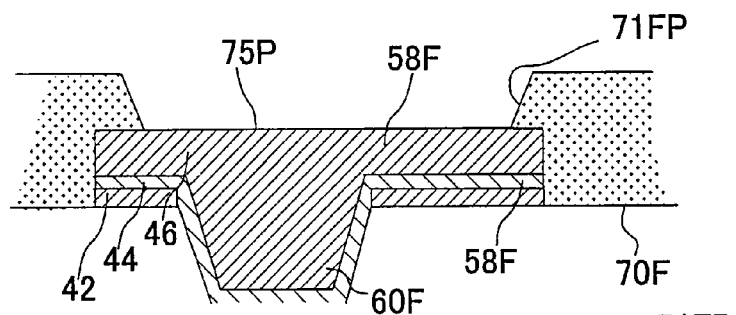
FIG. 11A-11D illustrate enlarged cross-sectional views of a pad of the printed wiring board according to the first embodiment.
Figure 11B:
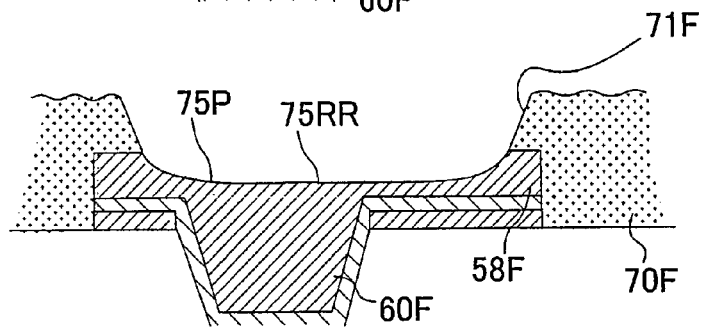

By wet blasting, a surface of the solder resist layer (70F) is roughened and a semispherical recess (75RR) is formed on the second pad (75P) in the second opening (71FP) (FIG. 5A). In FIG. 11A, the second pad (75P) before the formation of the semispherical recess in a circle (C1) in FIG. 4B is illustrated. In FIG. 11B, the second pad after the formation of the semispherical recess in a circle (C2) in FIG. 5A is illustrated. Since the first opening (71FI) has a small diameter, a deep recess is not formed on the first pad (75I). Here, the roughening is performed using wet blasting. However, it is also possible to use a plasma treatment or the like.

Figure 11C:
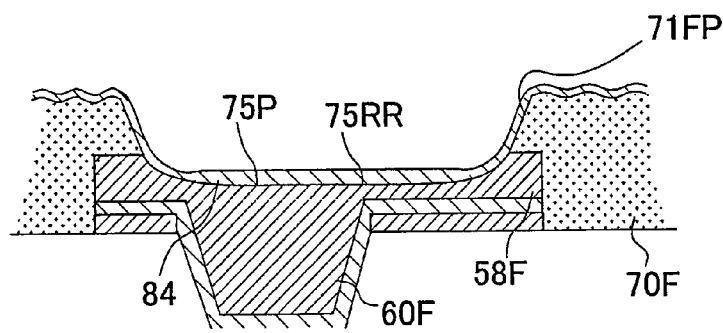

A resist (82S) is formed on a surface of the lower side solder resist layer (70S). The Ti/Cu seed layer 84 is formed using sputtering on the surface of the upper side solder resist layer (70F), and in the first opening (71FI) and the second opening (71FP) (FIG. 5B). Here, the Ti/Cu seed layer is formed using sputtering. However, the seed layer can also be formed using electroless copper plating. In FIG. 11C, the second pad (75P) after the formation of the seed layer 84 in a circle (C3) in FIG. 5B is illustrated.

On the solder resist layer (70F) of the printed wiring board 101, the second opening (71FP) is exposed, and a plating resist (82F) having a resist opening (82A) of a diameter smaller than the diameter of the second opening is formed (FIG. 6A). A current is applied via the seed layer 84, electrolytic copper plating 86 is filled in the resist opening (82A), and the metal post 77 is formed (FIG. 6B).

Buffing is performed for multiple times using a buff roll from coarse polishing to finishing polishing so that the height of the metal post 77 is H (FIG. 7A). At the same time, roughening treatment is performed on the top part of the metal post. As a result, the top part of the metal post is roughened to have a roughness larger than the average roughness (Ra) of 0.03-0.26. Due to the roughening, a surface area of the top part is increased, and adhesion between the top part and a solder formed on the top part is enhanced. Here, buffing is performed. However, for polishing the top part, it is also possible to performed grinder processing using a grinding wheel, CMP processing using a nonwoven fabric, or cutting processing using a diamond bite.

Figure 11D:
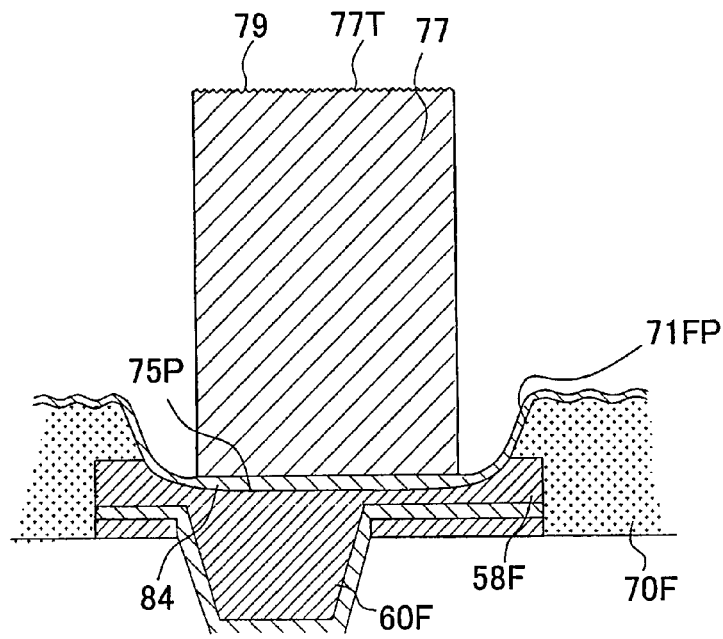

The upper side plating resist (82F) is peeled off, and the metal post 77 is exposed (FIG. 7B). In FIG. 11D, the exposed metal post in a circle (C4) in FIG. 7B is illustrated. As described above, the roughened layer 79 is formed on the top part (77T).

On the solder resist layer (70F), the seed layer 84 that is exposed from the metal post 77 is peeled off by soft etching, and the lower side resist (82S) is peeled off (FIG. 8A). In FIG. 12A, the metal post in a circle (C5) in FIG. 8A is illustrated. In addition to the semispherical recess (75RR) of the pad (75P) illustrated in FIG. 11B, a surface of the second pad (75P) around the metal post is dissolved by soft etching, and the ring-shaped recess (75PR) concentric with the axis (Z1) of the metal post is formed in the second pad (75P). The interface between the metal post 77 and the second pad (75P) (the bottom part (77B) of the metal post) is at the position that is higher than the lowest part of the recess (75PR) by f2 and is lower than the highest part of the second pad (75P) (the upper surface of the conductor layer (58F)) by f2. Further, by the etching, the surface of the top part (77T) is also dissolved, and the roughness of the roughened layer 79 is adjusted to be the average roughness (Ra) of 0.03-0.26.

An oxidation prevention surface treatment film 72 is applied on the first pad (75I) exposed from the first opening (71FI) of the upper side solder resist layer (70F) and on the pad (71 SP) exposed from the opening (71S) of the lower side solder resist layer (70S), and the printed wiring board 10 is completed (FIG. 8B). The oxidation prevention surface treatment film 72 is a film for preventing oxidation of the pads. In addition to OSP, examples of the protective film include Ni/Au, Ni/Pd/Au, Sn, and the like.

The solder bump 94 is formed on the first pad (75I) of the solder resist layer (70F) of the printed wiring board 10 (FIG. 9A). The IC chip 90 is mounted on the first pad (75I) via the solder bump 94 and a pad 92 (FIG. 9B). The mold resin (underfill) 80 is filled on the printed wiring board, matching an upper surface of the IC chip 90 (FIG. 10A). In FIG. 12B, the metal post in a circle (C6) in FIG. 10A is illustrated. In the first embodiment, the diameter (d3) of the second pad (75P) is larger than the diameter (d2) of the second opening. The diameter of the pad is a diameter of a portion of a conductor (a conductor circuit or a via conductor) that is exposed from the solder resist layer. An outer edge (75PE) of the second pad (75P) extends to a back surface of the solder resist layer (70F). Therefore, the mold resin 80 wraps around the back surface of the solder resist layer so that adhesion between the solder resist layer and the mold resin is high. An opening (80A) that exposes a solder plating film 88 of the top part of the metal post 77 is formed in the mold resin 80 using laser (FIG. 10B).

The other printed wiring board (upper substrate) 110 is joined to the metal post 77 via a solder bump 112. The other printed wiring board 110 is mounted on the printed wiring board 10 (FIG. 1).

In the first embodiment, the top part of the metal post 77 is polished and the height of the metal post 77 is H. Therefore, the connection reliability of the printed wiring board with the upper substrate is enhanced.

In the method for manufacturing the printed wiring board according to the first embodiment, the solder resist layer (70F) is formed that has the first opening (71FI) for connecting to the IC chip and the second opening (71FP) for forming the metal post for connecting to the upper substrate. The metal post 77 is first formed in the second opening without forming a solder bump in the first opening. Without being affected by a solder bump, reliability of the metal post during formation can be enhanced, and connection reliability between the upper substrate and the metal post can be improved.

First Modified Example of First Embodiment

Figure 13A:
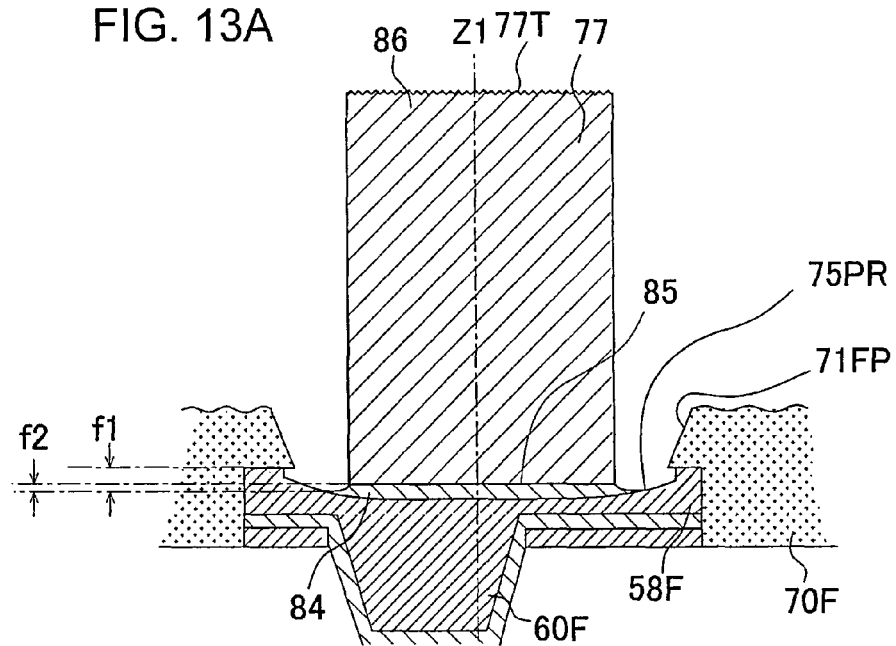
FIGS. 13A and 13B illustrate cross-sectional views of a metal post of a printed wiring board according to a modified example of the first embodiment.

A metal post of the printed wiring board 10 according to a first modified example of the first embodiment of the present invention is illustrated in FIG. 13A.

In the first modified example of the first embodiment, the recess (75PR) concentric with the axis (Z1) of the metal post is formed around the metal post by the second pad (75P) and the seed layer 84 remaining around the metal post. In this case, a pad includes a portion of the second pad (75P) exposed from the seed layer and an upper surface of the seed layer 84. The metal post 77 includes only the electrolytic plating film 86 formed on the seed layer. The interface 85 between the seed layer 84 of the metal post and the electrolytic copper plating layer 86 is at a position that is higher than a lowest part of a recess (75FP) by f2 μm lower than a highest part of the pad by f1 μm. Also in the first modified example of the first embodiment, the connection reliability of the metal post is enhanced by the concentric recess (75PR).

Second Modified Example of First Embodiment

Figure 13B:
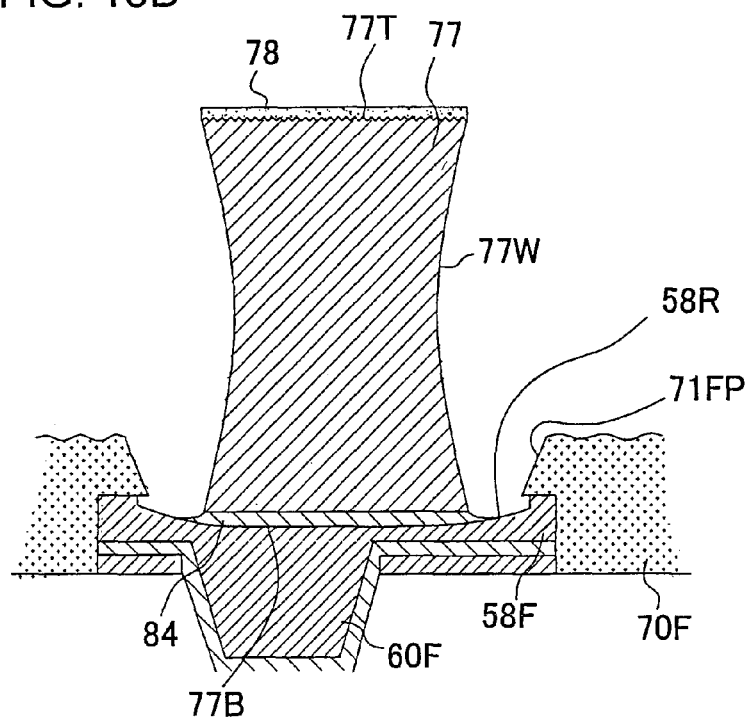

A metal post of the printed wiring board 10 according to a second modified example of the first embodiment of the present invention is illustrated in FIG. 13B.

In the second modified example of the first embodiment, the side wall (77W) of the metal post 77 is curved. The diameter of the post becomes smaller between the upper surface and the lower surface. Since the metal post has a thin portion, the metal post can be easily deformed. Therefore, the stress is relaxed. Even when the pitch (p1) between the pads (75P) is 0.3 mm or less, the connection reliability between the printed wiring board according to the second modified example of the first embodiment and the upper substrate is not decreased.

In the printed wiring board of the second modified example of the first embodiment, the side wall (77W) of the metal post 77 is curved, and the metal post 77 has the thin portion between the top part (77T) and the bottom part (77B). Therefore, the rigidity of the metal post is lowered, and the stress can be relaxed by the metal post. Therefore, the connection reliability between the upper substrate and the metal post is improved. Further, a surface area of the side wall (77W) of the metal post 77 is increased. Therefore, a contact area between the mold resin 80 molding the metal post and the metal post is increased, and the reliability of the metal post is enhanced.

In the second modified example of the first embodiment, a solder plating film 78 is formed on the top part (77T) of the metal post by solder plating. As the solder, Sn/Ag solder or Sn/Ag/Cu solder can be used. Further, instead of a solder layer, a Sn layer can be provided.

Third Modified Example of First Embodiment

Figure 14A:
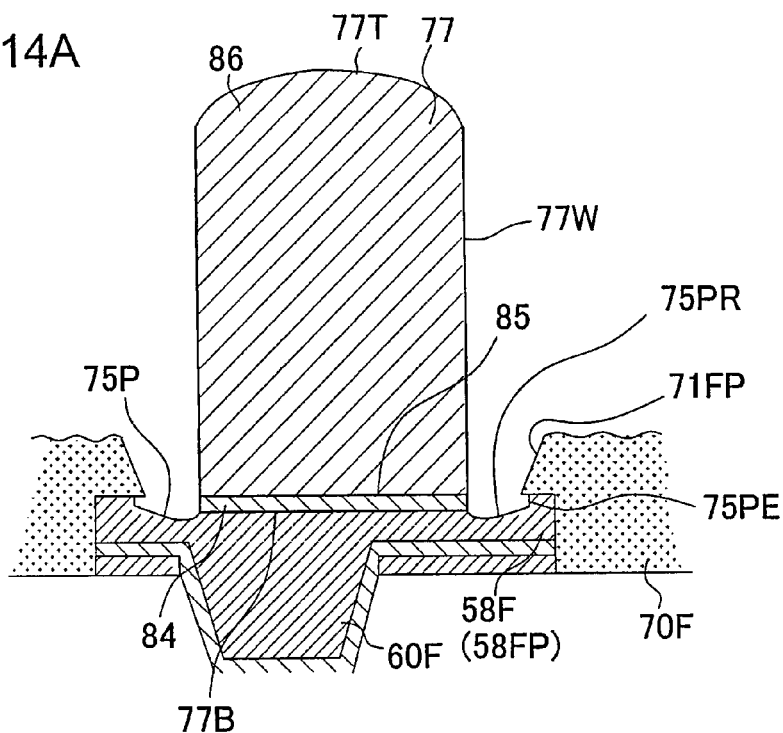
FIGS. 14A and 14B illustrate cross-sectional views of a metal post of a printed wiring board according to a modified example of the first embodiment.

A metal post of the printed wiring board 10 according to a third modified example of the first embodiment of the present invention is illustrated in FIG. 14A.

In the printed wiring board according to the third modified example of the first embodiment, the top part (77T) of the metal post 77 is formed to have a curved convex shape.

Fourth Modified Example of First Embodiment

Figure 14B:
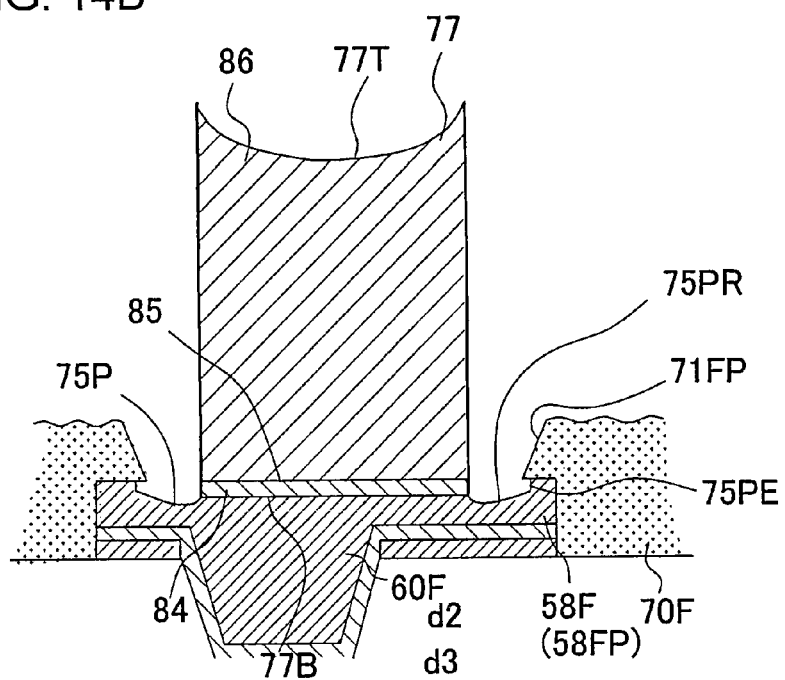

A metal post of the printed wiring board 10 according to a fourth modified example of the first embodiment of the present invention is illustrated in FIG. 14B.

In the printed wiring board according to the fourth modified example of the first embodiment, a recess is formed on the top part (77T) of the metal post 77. In the fourth modified example, adhesion between the top part (77T) and the solder bump 112 (see FIG. 1) of the upper substrate 110 is high.

In a printed wiring board having metal posts formed in a plating process, when the printed wiring board has bumps for mounting an IC chip and the metal posts for mounting an upper substrate, a distance between the printed wiring board and the upper substrate is larger than a distance between the printed wiring board and the IC chip. Therefore, connection reliability may be reduced, when the printed wiring board and the upper substrate are connected via the metal post having a large height.

A printed wiring board according to an embodiment of the present invention improves connection reliability between the printed wiring board and an upper substrate mounted on the printed wiring board, and another embodiment of the present invention is a method for manufacturing such a printed wiring board.

A printed wiring board according to an embodiment of the present invention includes: an uppermost interlayer resin insulating layer; a pad that is formed on the uppermost interlayer resin insulating layer; a metal post that is formed on the pad by plating; and a solder resist layer that is formed on the uppermost interlayer resin insulating layer and has a first opening that is provided on a center side of the printed wiring board and exposes a pad for forming a bump, and a second opening that is provided on an outer peripheral side of the printed wiring board and exposes the pad on which the metal post is formed. The metal post has a diameter smaller than a diameter of the second opening. The diameter of the second opening is smaller than a diameter of the pad.

A method for manufacturing a printed wiring board according to another embodiment of the present invention includes: forming a solder resist layer on an outermost interlayer resin insulating layer and a conductor circuit containing mounting pads, the solder resist layer having a first opening that exposes a mounting pad on a center side of the printed wiring board and a second opening that exposes a mounting pad on an outer peripheral side of the printed wiring board; subjecting a surface of the solder resist layer to a roughening treatment and forming a recess on a surface of the mounting pad that is exposed from the second opening; forming a seed layer on the solder resist layer, in the first opening and the second opening, and on the mounting pads exposed from the first opening and the second opening; forming a plating resist on the recess of the mounting pad, the plating resist having a resist opening that has a diameter smaller than that of the second opening; filing the resist opening via the seed layer by electrolytic plating and forming a metal post; removing the plating resist; and removing the seed layer exposed on the solder resist layer.

In a printed wiring board according to another embodiment of the present invention and a method for manufacturing the printed wiring board according to another embodiment of the present invention, the diameter of the metal post is smaller than the diameter of the second opening of the solder resist layer. Therefore, the metal post is not in contact with the solder resist layer and does not receive a thermal stress from the solder resist layer. Therefore, connection reliability between the metal posts is high. Further, the pad has the recess around the metal post, the recess being concentric with an axis of the metal post. Therefore, a position of an interface between the seed layer and an electrolytic copper plating layer of the metal post and a position of an interface between the pad and sealing resin in contact with the pad are displaced from each other. Thus, a thermal stress from the sealing resin is reduced and the connection reliability of the metal post is enhanced.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
an uppermost interlayer resin insulating layer;
a plurality of first pads formed in a center portion of a surface of the uppermost interlayer resin insulating layer such that the plurality of first pads is positioned to mount an IC chip on the uppermost interlayer resin insulating layer;
a plurality of second pads formed in a peripheral portion of the surface of the uppermost interlayer resin insulating layer such that the plurality of second pads is positioned to mount a second printed wiring board on the uppermost interlayer resin insulating layer;
a plurality of metal posts formed on the plurality of second pads, respectively, such that the plurality of metal posts is configured to mount the second printed wiring board over the IC chip; and
a solder resist layer formed on the uppermost interlayer resin insulating layer and having a plurality of first opening portions and a plurality of second opening portions such that the plurality of first opening portions is exposing the plurality of first pads, respectively, and that the plurality of second opening portions is exposing the plurality of second pads, respectively,
wherein the plurality of metal posts is formed such that each of the metal posts has a diameter which is smaller than a diameter of each of the second opening portions, and the plurality of second opening portions is formed such that the diameter of each of the second opening portions is smaller than a diameter of each of the second pads;
each of the second pads has a concentric recess portion surrounding an end portion of a respective one of the metal posts such that the concentric recess portion has a concentric form with respect to an axis of the respective one of the metal posts; and
each of the metal posts comprises a seed layer and an electrolytic copper plating layer.

2. A printed wiring board according to claim 1, wherein each of the metal posts has a top portion formed such that the top portion has one of a curved concave shape and a curved convex shape.

3. A printed wiring board according to claim 1, wherein the seed layer and the electrolytic copper plating layer are formed such that an interface between the seed layer and a surface of a respective one of the second pads is positioned higher than a lowest point of the concentric recess portion and lower than a highest point of the respective one of the second pads.

4. A printed wiring board according to claim 1, wherein each of the metal posts has a top portion roughened such that the top portion has an average roughness Ra in a range of 0.03 to 0.26.

5. A printed wiring board according to claim 1, wherein the concentric recess portion of each of the second pads has an outer edge having a diameter which is greater than the diameter of each of the second opening portions such that the outer edge is positioned underneath a bottom surface of the solder resist layer.

6. A printed wiring board according to claim 1, wherein the plurality of metal posts is formed at a pitch in a range of 0.3 mm or less.

7. A printed wiring board according to claim 1, wherein each of the metal posts has the diameter in a range of 50 μm to 150 μm and an aspect ratio in a range of 0.6 to 1.5.

8. A printed wiring board according to claim 4, further comprising:
a mold resin layer comprising a resin filler material and formed on the solder resist layer such that the plurality of metal posts is formed in the mold resin layer.

9. A method for manufacturing a printed wiring board, comprising:
forming a solder resist layer on an uppermost interlayer resin insulating layer such that the solder resist layer has a plurality of first opening portions exposing a plurality of first pads, respectively, and a plurality of second opening portions exposing a plurality of second pads, respectively;
applying a roughening treatment to a surface of the solder resist layer such that a recess portion is formed on a surface of a respective one of the second pads;
forming a seed layer on the solder resist layer such that the seed layer is formed on the first pads in the first opening portions and the second pads in the second opening portions;
forming a plating resist layer on the seed layer such that the plating resist layer has a plurality of resist openings formed on the plurality of second pads, respectively, and each having a diameter which is smaller than a diameter of each of the second opening portions;
applying electrolytic plating on the seed layer in the plurality of resist openings such that a plurality of metal posts is formed in the plurality of resist openings, respectively, each of the metal posts having a diameter smaller than the second opening;
removing the plating resist layer from the seed layer; and
removing a portion of the seed layer exposed on the solder resist layer,
wherein the plurality of first pads is formed in a center portion of a surface of the uppermost interlayer resin insulating layer such that the plurality of first pads is positioned to mount an IC chip on the uppermost interlayer resin insulating layer, the plurality of second pads is formed in a peripheral portion of the surface of the uppermost interlayer resin insulating layer such that the plurality of second pads is positioned to mount a second printed wiring board on the uppermost interlayer resin insulating layer, and the plurality of metal posts is formed on the plurality of second pads, respectively, such that the plurality of metal posts is configured to mount the second printed wiring board over the IC chip.

10. A method for manufacturing a printed wiring board according to claim 9, wherein the roughening treatment comprises wet-blasting.

11. A method for manufacturing a printed wiring board according to claim 9, further comprising:
applying a polishing treatment to the plurality of metal posts such that a height of the plurality of metal posts is adjusted and top portions of the metal posts is roughened.

12. A method for manufacturing a printed wiring board according to claim 11, wherein the polishing treatment comprises buffing.

13. A package-on-package device, comprising:
a first printed wiring board;
an IC chip mounted on the first printed wiring board; and
a second printed wiring board mounted on the first printed wiring board such that the IC chip is positioned in a space formed between the first printed wiring board and the second printed wiring board, wherein the first printed wiring board includes an uppermost interlayer resin insulating layer, a plurality of first pads formed in a center portion of a surface of the uppermost interlayer resin insulating layer such that the plurality of first pads is positioned to mount the IC chip on the uppermost interlayer resin insulating layer, a plurality of second pads formed in a peripheral portion of the surface of the uppermost interlayer resin insulating layer such that the plurality of second pads is positioned to mount the second printed wiring board on the uppermost interlayer resin insulating layer, a plurality of metal posts formed on the plurality of second pads, respectively, such that the plurality of metal posts is configured to mount the second printed wiring board over the IC chip, and a solder resist layer formed on the uppermost interlayer resin insulating layer and having a plurality of first opening portions and a plurality of second opening portions such that the plurality of first opening portions is exposing the plurality of first pads, respectively, and that the plurality of second opening portions is exposing the plurality of second pads, respectively, the plurality of metal posts is formed such that each of the metal posts has a diameter which is smaller than a diameter of each of the second opening portions, and the plurality of second opening portions is formed such that the diameter of each of the second opening portions is smaller than a diameter of each of the second pads;

each of the second pads has a concentric recess portion surrounding an end portion of a respective one of the metal posts such that the concentric recess portion has a concentric form with respect to an axis of the respective one of the metal posts; and each of the metal posts comprises a seed layer and an electrolytic copper plating layer.

14. A package-on-package device according to claim 13, further comprising:

a mold resin layer comprising a resin filler material and formed on the solder resist layer such that the IC chip and the plurality of metal posts are formed in the mold resin layer.

15. A package-on-package device according to claim 14, wherein the first printed wiring board includes a plurality of first bumps connecting the IC chip to the plurality of first pads and a plurality of second bumps connecting the second printed wiring board to the plurality of metal posts.

16. A package-on-package device according to claim 15, wherein each of the metal posts has a top portion formed such that the top portion has one of a curved concave shape and a curved convex shape.

* * * * *